(12) United States Patent
Bernier et al.

(10) Patent No.: US 11,810,893 B2
(45) Date of Patent: Nov. 7, 2023

(54) SILICON INTERPOSER SANDWICH STRUCTURE FOR ESD, EMC, AND EMC SHIELDING AND PROTECTION

(71) Applicant: International Business Machines Corporation, Armonk, NY (US)

(72) Inventors: William Emmett Bernier, Endwell, NY (US); Bing Dang, Chappaqua, NY (US); John Knickerbocker, Monroe, NY (US); Son Kim Tran, Endwell, NY (US); Mario J. Interrante, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/334,937

(22) Filed: May 31, 2021

(65) Prior Publication Data
US 2021/0288022 A1    Sep. 16, 2021

Related U.S. Application Data

(63) Continuation of application No. 15/688,369, filed on Aug. 28, 2017, now Pat. No. 11,049,841, which is a
(Continued)

(51) Int. Cl.
*H01L 23/00* (2006.01)
*H01L 23/552* (2006.01)
(Continued)

(52) U.S. Cl.
CPC ............ *H01L 24/81* (2013.01); *H01L 23/367* (2013.01); *H01L 23/49816* (2013.01);
(Continued)

(58) Field of Classification Search
None
See application file for complete search history.

(56) References Cited

U.S. PATENT DOCUMENTS

| 2,597,081 | A | 5/1952 | Goodhue |
| 4,155,615 | A | 5/1979 | Zimmerman, Jr. et al. |

(Continued)

FOREIGN PATENT DOCUMENTS

| CN | 101980360 | 2/2011 |
| CN | 103843134 | 6/2014 |
| WO | 2013052342 | 4/2013 |

OTHER PUBLICATIONS

International Search Report PCT/US12/57529; dated Dec. 6, 2012 4 pages.
(Continued)

*Primary Examiner* — Michelle Mandala
(74) *Attorney, Agent, or Firm* — Daniel Morris; Otterstedt & Kammer PLLC

(57) ABSTRACT

An interposer sandwich structure includes a top interposer and a bottom interposer enclosing an integrated circuit electronic device that includes an attachment for attaching the device to the bottom interposer, and an interconnection structure connecting the top interposer to the bottom interposer. The top interposer may also be directly connected to a chip carrier in addition to the bottom interposer. The structure provides shielding and protection of the device against Electrostatic Discharge (ESD), Electromagnetic Interference (EMI), and Electromagnetic Conductivity (EMC) in miniaturized 3D packaging.

1 Claim, 2 Drawing Sheets

Related U.S. Application Data continuation of application No. 15/131,171, filed on Apr. 18, 2016, now abandoned, which is a continuation of application No. 13/251,987, filed on Oct. 3, 2011, now abandoned.

(51) Int. Cl.
  *H01L 23/498* (2006.01)
  *H01L 25/065* (2023.01)
  *H01L 23/367* (2006.01)
  *H01L 23/60* (2006.01)

(52) U.S. Cl.
  CPC .. *H01L 23/49827* (2013.01); *H01L 23/49833* (2013.01); *H01L 23/552* (2013.01); *H01L 23/60* (2013.01); *H01L 24/09* (2013.01); *H01L 25/0655* (2013.01); H01L 2224/08238 (2013.01); H01L 2224/16225 (2013.01); H01L 2224/81192 (2013.01); H01L 2924/014 (2013.01); H01L 2924/0105 (2013.01); H01L 2924/01014 (2013.01); H01L 2924/01028 (2013.01); H01L 2924/01029 (2013.01); H01L 2924/01047 (2013.01); H01L 2924/01082 (2013.01); H01L 2924/14 (2013.01); H01L 2924/1433 (2013.01); H01L 2924/1461 (2013.01); H01L 2924/1579 (2013.01); H01L 2924/15192 (2013.01); H01L 2924/15311 (2013.01); H01L 2924/15331 (2013.01); H01L 2924/15738 (2013.01); H01L 2924/15787 (2013.01); H01L 2924/19105 (2013.01)

(56) References Cited

U.S. PATENT DOCUMENTS

| | | | |
|---|---|---|---|
| 4,433,886 A | 2/1984 | Cassarly et al. | |
| 5,241,453 A | 8/1993 | Bright et al. | |
| 5,357,404 A | 10/1994 | Bright et al. | |
| 5,525,066 A | 6/1996 | Morlion et al. | |
| 5,572,408 A | 11/1996 | Anhalt et al. | |
| 5,588,851 A | 12/1996 | Morlion et al. | |
| 6,192,577 B1 | 2/2001 | Arsson | |
| 6,780,056 B1 | 8/2004 | Neidich | |
| 7,002,217 B2 | 2/2006 | Hollingsworth | |
| 7,245,507 B2 | 7/2007 | DiBene et al. | |
| 7,276,799 B2 | 10/2007 | Lee et al. | |
| 7,439,613 B2 | 10/2008 | Joshi et al. | |
| 7,622,786 B2 | 11/2009 | England | |
| 7,709,915 B2* | 5/2010 | Morrison | H01L 27/14625 257/432 |
| 7,733,621 B2 | 6/2010 | Anthony et al. | |
| 7,777,330 B2 | 8/2010 | Pelley et al. | |
| 8,981,577 B2 | 3/2015 | Joshi | |
| 9,275,976 B2 | 3/2016 | Zhao | |
| 9,875,911 B2 | 1/2018 | Pagaila et al. | |
| 2005/0046002 A1* | 3/2005 | Lee | H01L 24/24 257/E21.705 |
| 2007/0246813 A1 | 10/2007 | Ong et al. | |
| 2007/0290322 A1 | 12/2007 | Zhao et al. | |
| 2008/0157344 A1 | 7/2008 | Chen et al. | |
| 2009/0001612 A1 | 1/2009 | Song et al. | |
| 2009/0079071 A1 | 3/2009 | Webb | |
| 2009/0146315 A1 | 6/2009 | Shim et al. | |
| 2010/0065948 A1 | 3/2010 | Bae et al. | |
| 2010/0078779 A1 | 4/2010 | Barth et al. | |
| 2010/0164076 A1* | 7/2010 | Lee | H01L 25/0657 257/659 |
| 2010/0237386 A1 | 9/2010 | Lin et al. | |
| 2010/0244223 A1* | 9/2010 | Cho | H01L 23/49575 257/E23.141 |
| 2010/0320577 A1 | 12/2010 | Pagaila et al. | |
| 2011/0068459 A1 | 3/2011 | Pagaila et al. | |
| 2011/0233748 A1* | 9/2011 | Joshi | H01L 23/3128 257/E23.141 |
| 2013/0082365 A1 | 4/2013 | Bernier et al. | |
| 2016/0233190 A1 | 8/2016 | Bernier et al. | |
| 2017/0358552 A1 | 12/2017 | Bernier et al. | |
| 2018/0350768 A1 | 12/2018 | Bernier et al. | |

OTHER PUBLICATIONS

Paul J. Otterstedt, List of IBM Patents or Patent Applications Treated as Related, Jun. 8, 2023, pp. 1-2.
PCT Recordation of Search History US2012/057529; dated Dec. 6, 2012 3 pages.
Siemens et al. Shielding and Interconnection Interposer Substrate; Ip.com PriorArtDatabase; Apr. 24, 2008; PCOM00169379D; Copyright Siemens AG 2008 3 pages.
Written Opinion of the International Searching Authority PCT/US12/57529; dated Dec. 6, 2012 6 pages.

* cited by examiner

SILICON INTERPOSER SANDWICH STRUCTURE FOR ESD, EMC, AND EMC SHIELDING AND PROTECTION

CROSS-REFERENCE TO RELATED APPLICATIONS

This application is a continuation of U.S. patent application Ser. No. 15/688,369 filed Aug. 28, 2017, which is in turn a continuation of U.S. patent application Ser. No. 15/131,171 filed Apr. 18, 2016, which is in turn a continuation of U.S. patent application Ser. No. 13/251,987 filed Oct. 3, 2011. The complete disclosures of U.S. patent application Ser. No. 15/688,369, U.S. patent application Ser. No. 15/131,171, and U.S. patent application Ser. No. 13/251,987 are all hereby expressly incorporated herein by reference in their entireties for all purposes.

BACKGROUND

The field of the invention comprises miniaturization of electronics through 3D packaging structures incorporating integrated circuit devices protected against Electrostatic Discharge (ESD), Electromagnetic Interference (EMI), and Electromagnetic Conductivity (EMC)

Miniaturization of electronics is a continuously evolving process in devices generated today. One way of achieving this is with 3D packaging using interposers incorporating Through Silicon Vias (TSV's). The TSV's allow a variety of additional function such as capacitance, resistance, inductance, and simple circuitry to be placed close to integrated circuits. These circuits are interconnected electrically and supported structurally while allowing efficient dissipation of heat. Such 3D packaging structures incorporating integrated circuit devices need to be protected from ESD which may damage or destroy circuitry, EMI from emission sources in the nearby environment, and EMC resulting in emission from the device requiring control so as to not interfere with other devices.

As 3D packaging continues to advance in complexity, multiple integrated circuit devices present on the same interposer silicon carrier will require simple modes of separation and isolation from ESD, EMI and EMC factors. Currently available technology can achieve the necessary isolation and protection of integrated circuit function but only at the cost of loss of the desired miniaturization. Individual devices must be placed on isolated interposers and large structures must be designed to shield and protect the integrated circuit device function. These would be constructed with base plates, lids, gaskets, and device separation common in the industry for shielding and protection but this defeats the enhancement of functional proximity otherwise afforded by the interposer TSV 3D packaging.

The following patents, published applications, and literature exemplify the state of the art in the field of 3D packaging:

Barth, et al., United States Published Patent Application No. 2010/0078779;
Morrison, et al., U.S. Pat. No. 7,709,915;
DiBiene, et al., U.S. Pat. No. 7,245,507;
Lim, et al., IP.COM Technical Disclosure, IPCOM000169379D, "Shielding and Interconnection Interposer Substrate", Apr. 24, 2008;
Pelley, et al., U.S. Pat. No. 7,777,330;
Lin, et al., United States Published Patent Application No. 2010/0237386;
Anthony, et al., U.S. Pat. No. 7,733,621;
England, et al., U.S. Pat. No. 7,622,786;
Hollingsworth, et al., U.S. Pat. No. 7,002,217;
Neidich, et al., U.S. Pat. No. 6,780,056.

SUMMARY OF THE INVENTION

The present invention comprises structures, articles of manufacture, processes and products produced by the processes that address the foregoing needs, and provides ESD, EMI and EMC shielding and protection of integrated circuit devices in 3D packaging. Examples of these devices comprise electronic devices such as semiconductor chips, semiconductor arrays, or wafers, or IC electronic components (integrated circuits, i.e., "IC chips") and other components such as but not limited to micro-electro-mechanical (MEMS) components, passive filters, detector arrays, photovoltaic displays, organic light-emitting diodes (OLEDs) and the like or SiGe, a III-V electronic device, or optoelectronics.

In one embodiment, this innovative idea provides for ESD, EMI and EMC shielding and protection of integrated circuit devices in 3D packaging by creating a sandwich of interposers around the integrated circuit device in which metallized shielding and diode protective devices may be incorporated into both the top and bottom interposers. TSV's would allow interconnection of the metallized shielding to ground or voltage as required electrically, and the bottom interposer in the sandwich connecting by TSV's and solder connection to the chip carrier package, and the top interposer connecting peripherally by TSV's beyond the outline of the integrated circuit device to the bottom interposer which would then connect electrically to the chip carrier. This would provide a miniature localized cage around the device and preserve the scale of integration and miniaturization desired with this technology.

In addition, multiple integrated circuit devices, which normally would need to be isolated in much larger or even separate packages, now may be placed adjacent to one another on the same interposer with TSV's by providing one or more top interposers to isolate the sensitive devices from one another in close proximity in the miniaturized sandwich package structure.

In one embodiment, the interposer sandwich structure as shown in FIG. 1 comprises two interposers enclosing a device requiring shielding or protection. A solder bump size hierarchy may be used with smaller solder bumps attaching the integrated circuit device to the interposer on the bottom, and larger solder bumps or other interconnection structure connecting the top interposer with the bottom interposer or directly with the chip carrier. The other interconnection structure may comprise copper post bumps or equivalent metal post bumps known in the art. In another embodiment, these metal post bumps (e.g., copper) extends from either the top or the bottom interposer toward a solder bump on the bottom interposer for connecting the two by soldering. The height of the structure is substantially the same whether employing solder bumps or metal post bumps (e.g., copper). The combined height of the bumps is about 50 um (microns), and the ratio of the heights of the larger bumps to the smaller bumps is about 3:1.

The top interposer has a blanket metal coating on the bottom or top surface and the connections to the bottom interposer or the chip carrier would be to electrical ground or bias depending on the function required. As shown in FIG. 2, one or more devices connected to the bottom interposer may be shielded with a top interposer selectively to provide the functional isolation for shielding or protection desired, for maximum miniaturization. Thermal interface material can be dispensed on the back of the integrated circuit device prior to joining the top interposer in order to provide for rapid heat dissipation from the integrated circuit device if required.

BRIEF DESCRIPTION OF THE DRAWINGS

The accompanying drawings are not necessarily drawn to scale but nonetheless set out the invention, and are included to illustrate various embodiments of the invention, and together with this specification also serve to explain the principles of the invention. These drawings comprise various Figures that illustrate ESD, EMI and EMC shielding and protection of integrated circuit devices in 3D packaging.

DETAILED DESCRIPTION OF THE INVENTION

To achieve the foregoing and other advantages, and in accordance with the purpose of this invention as embodied and broadly described herein, the following detailed description comprises disclosed examples of the invention that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention. The written description, claims, abstract of the disclosure, and the drawings that follow set forth various features, objectives, and advantages of the invention and how they may be realized and obtained. These features, objectives, and advantages will also become apparent by practicing the invention.

Figure 1:
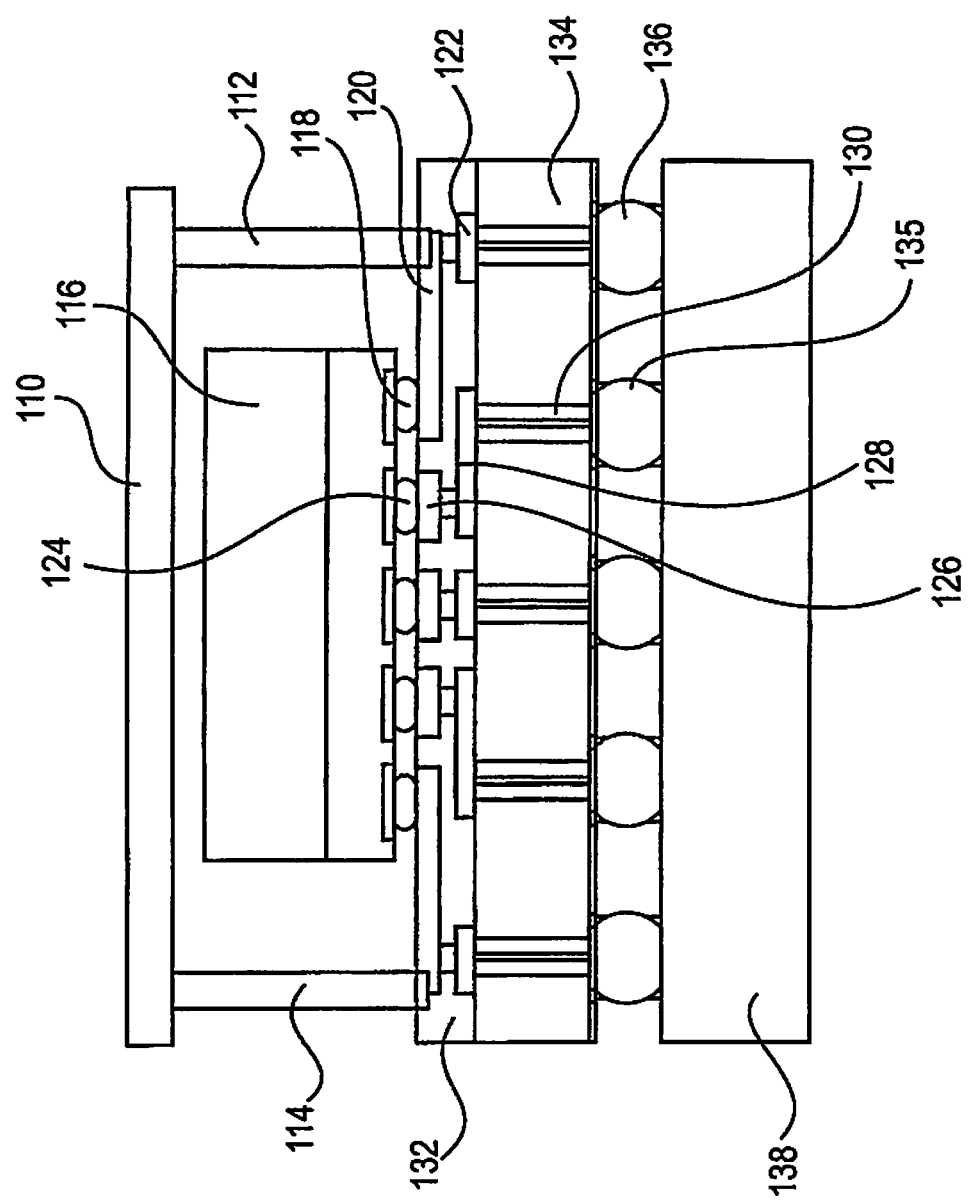
FIGS. 1-2 comprise side elevations in cross-section illustrating structures for ESD, EMI and EMC shielding and protection of integrated circuit devices in 3D packaging.
Figure 2:
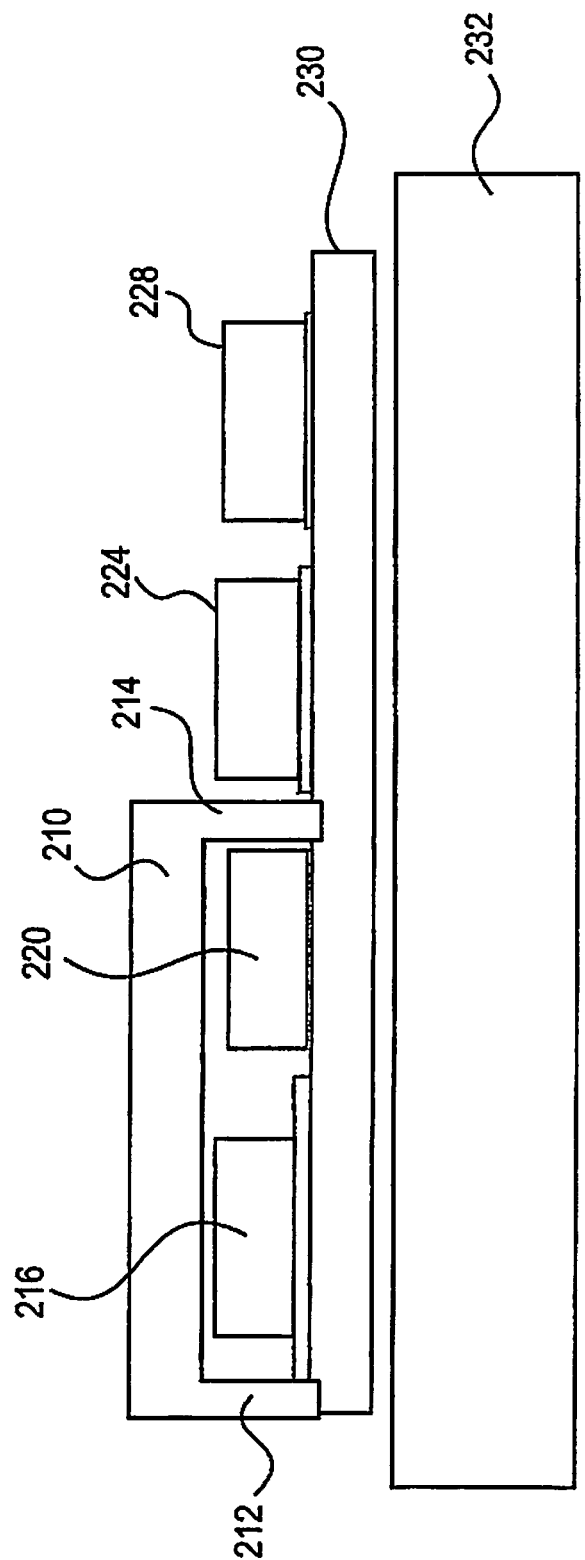

As noted before, the interposer sandwich structure as shown in FIG. 1 comprises two interposers enclosing a device requiring shielding or protection. A solder or metal post bump size hierarchy may be used with smaller solder bumps attaching the integrated circuit device to the interposer on the bottom, and larger solder or metal post bumps or other interconnection structure connecting the top interposer with the bottom interposer or directly with the chip carrier. The top interposer has a blanket metal coating on the bottom or top surface, and the connections to the bottom interposer or the chip carrier would be to electrical ground or bias, depending on the function required. As shown in FIG. 2 one or more devices connected to the bottom interposer may be shielded with a top interposer selectively to provide the functional isolation for shielding or protection desired for maximum miniaturization. Thermal interface material can be dispensed on the back of the integrated circuit device prior to joining the top interposer in order to provide for rapid heat dissipation from the integrated circuit device if required.

FIG. 1, illustrates a interposer sandwich structure for ESD, EMI, and EMC shielding and protection having a top interposer 110, and interconnectors 112 and 114 comprising joined solder bumps, as described herein or metal posts capped with solder alloy. An Application Specific Integrated Circuit (ASIC) 116 is position under top interposer 110 that is operatively associated with chip ground I/O interconnection 118.

A first metal layer 120 is positioned on BEOL dielectric layer 132 and a second metal layer 122 on the bottom interposer 134. We also form a chip signal I/O interconnection 124 and a chip signal I/O interconnection 126 (substantially the same as 124) both positioned on the device as shown. A second metal layer 128 contacts the bottom interposer 134. A through-Si-Via interconnection 130 forms an electrical connection to chip carrier 138 through connector 135. We position BEOL dielectric layer 132 on bottom interposer 134 which is operatively associated with second level ground I/O interconnection 136 and Chip carrier 138.

FIG. 2 illustrates top Interposer 210 with interconnectors 212 and 214 constructed of solder bumps or metal posts (Cu or Ni, or the art-known equivalents thereof) positioned above chips 216 and 220. Chip 224 and chip 228 are positioned away from the interposer to illustrate that the invention may be used in limited areas on a device or devices mounted on a chip carrier such as chip carrier 232. These chips 216, 220, 224, and 228 are operatively associated with structure 230 that comprises capacitors and wiring input/output (I/O) that is mounted on chip carrier 232.

Interconnectors 112, 114, 212, and 214 as noted comprise solder (SnPb, SnAg, SnAgCu, or the art-known equivalents thereof) bumps or metal (Cu or Ni or the art-known equivalents thereof.) posts capped with solder alloy. In those instances we employ shorter interconnectors between the chip and the lower interposer before assembly of upper interposer to the lower interposer with taller interconnectors. The shorter interconnectors are about one-third the height of the taller interconnects between the upper interposer and the lower interposer.

The interposers comprise a structure made of Si or other materials such as ceramics used in microcircuit technology (e.g., SiC) and the art-know equivalents thereof, or polymers, such as polyimides, phenolics or epoxies and the art-know equivalents thereof.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter or the meaning ordinarily ascribed to these terms by a person with ordinary skill in the art. In another embodiment, the terms "about," "substantial," or "substantially," when employed to define numerical parameter include, e.g., a variation up to five per-cent, ten per-cent, or 15 per-cent, or somewhat higher.

The term "operatively associated" as used in this specification means at least two structures and/or materials or compounds or compositions connected to or aligned with one another to perform a function, such as electrical conductance, electrical shielding, electrical insulation, or heat shielding, or in some way to enhance the performance of one or the other or both.

All scientific journal articles and other articles, including Internet sites, as well as issued and pending patents that this written description or applicants' Invention Disclosure Statements mention, including the references cited in such scientific journal articles and other articles, including Internet sites, and such patents, are incorporated herein by reference in their entirety and for the purpose cited in this written description and for all other disclosures contained in such scientific journal articles and other articles, including internet sites as well as patents and the references cited therein, as all or any one may bear on or apply in whole or in part, not only to the foregoing written description, but also the following claims, and abstract of the disclosure.

Although the inventors have described their invention by reference to some embodiments, other embodiments defined by the doctrine of equivalents are intended to be included as falling within the broad scope and spirit of the foregoing written description, and the following claims, and abstract of the disclosure.

What is claimed is:

1. A method for mutually electromagnetically isolating first and second adjacent integrated circuit (IC) devices that are attached to a first side of a common bottom interposer by respective attaching structures that comprise small bumps, the method comprising:

attaching the common bottom interposer to a chip carrier with the first and second adjacent IC devices facing away from the chip carrier;

attaching a first top interposer to the common bottom interposer with the first top interposer covering the first IC device and with large bumps of the first top interposer contacting through-silicon vias (TSVs) of the common bottom interposer around all edges of the first IC device, wherein the TSVs of the common bottom interposer electrically connect a blanket metal shield of the first top interposer to a ground of the chip carrier; and attaching a second top interposer to the common bottom interposer with the second top interposer covering the second IC device and with large bumps of the second top interposer contacting through-silicon vias (TSVs) of the common bottom interposer around all edges of the second IC device, wherein the TSVs of the common bottom interposer electrically connect a blanket metal shield of the second top interposer to a ground of the chip carrier.

* * * * *